United States Patent [19]
Carter

[11] 4,097,772
[45] Jun. 27, 1978

[54] MOS SWITCH WITH HYSTERESIS

[75] Inventor: Ernest Aubert Carter, Phoenix, Ariz.

[73] Assignee: Motorola, Inc., Schaumburg, Ill.

[21] Appl. No.: 803,500

[22] Filed: Jun. 6, 1977

[51] Int. Cl.² .................... H03K 3/295; H03K 3/353; H03K 17/04

[52] U.S. Cl. .................... 307/279; 307/251; 307/264; 307/289; 307/360; 307/DIG. 1

[58] Field of Search ............... 307/264, 270, 279, 289, 307/290, 291, 251, 360, DIG. 1

[56] References Cited

U.S. PATENT DOCUMENTS

| | | | |
|---|---|---|---|
| 3,612,908 | 10/1971 | Heimbigner | 307/279 |
| 3,882,331 | 5/1975 | Sasaki | 307/279 |
| 3,900,746 | 8/1975 | Kraft et al. | 307/264 |
| 3,916,430 | 10/1975 | Heuner et al. | 307/279 X |
| 4,023,050 | 5/1977 | Fox et al. | 307/DIG. 1 X |
| 4,031,409 | 6/1977 | Shimada et al. | 307/DIG. 1 X |

OTHER PUBLICATIONS

Hoffman, "Positive Voltage Translation Circuit"; IBM Tech. Discl. Bull.; vol. 17, No. 8, pp. 2392–2393; 1/1975.

Primary Examiner—Larry N. Anagnos
Attorney, Agent, or Firm—Joe E. Barbee

[57] ABSTRACT

An MOS circuit possessing hysteresis and positive feedback for fast switching includes a first MOSFET having its gate connected to an input. A second depletion mode MOSFET has its drain connected to the source of the first MOSFET and its source connected to ground. A third depletion mode MOSFET has its drain connected to the source of the first MOSFET and its gate and source connected to the drain of a fourth MOSFET and to the gate of a fifth MOSFET. The gate of the fourth MOSFET is connected to the gate and source of a sixth depletion mode MOSFET and to the drain of the fifth MOSFET. The fifth MOSFET has its source connected to ground.

5 Claims, 1 Drawing Figure

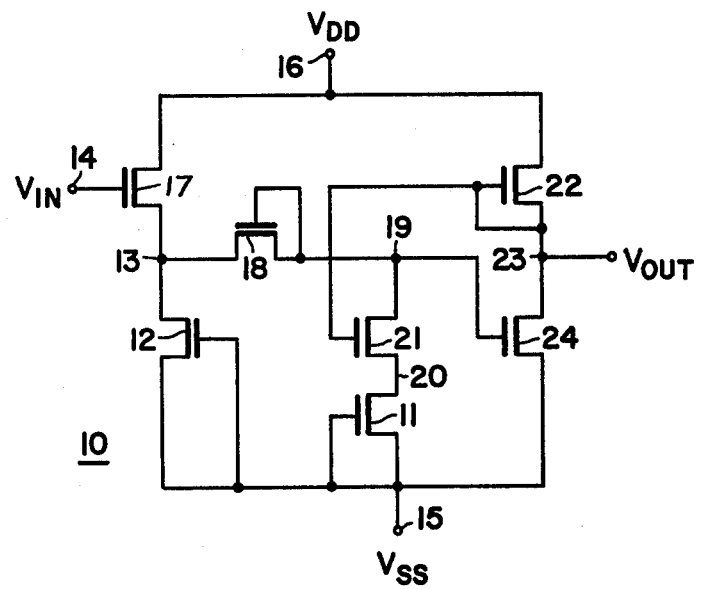

MOS SWITCH WITH HYSTERESIS

BACKGROUND OF THE INVENTION

1. Field of the Invention

The invention relates to MOS hysteresis switching curcuits.

2. Brief Description of the Prior Art

MOS buffer circuits have been widely utilized to interface between inputs provided by external circuits and other more complex circuitry which acts in response to the input signals. However, most MOS buffer circuits do not provide very good noise immunity. Various types of latch circuits have been utilized in the prior art MOS buffer circuits, but the noise immunity of such latch circuits has been quite unsymmetrical, and the switching speed in at least one direction has been unsatisfactory considering the amount of power dissipation of such prior art latch circuits.

SUMMARY OF THE INVENTION

It is an object of the invention to provide a simple buffer circuit having more symmetrical noise immunity and rapid switching to both logical states.

Briefly described, the invention is a hysteresis circuit. An input of the hysteresis circuit is coupled to an inverting field effect transistor coupled in series with the load circuit of the first inverting circuit. A depletion mode field effect transistor has its drain coupled to the source of the input field effect transistor and its source coupled to a reference voltage conductor. The gate of the depletion mode field effect transistor is coupled to an output of the second inverter circuit.

DESCRIPTION OF THE INVENTION

Referring to the the FIGURE, hysteresis circuit 10 is coupled between $V_{DD}$ conductor 16 and ground conductor 15. The voltage $V_{IN}$ is applied to input 14, which is connected to the gate of MOSFET 17. MOSFET 17 has its drain connected to $V_{DD}$ and its source connected to node 13. Depletion mode MOSFET 12 has its drain connected to node 13 and its source and gate connected to $V_{SS}$, also referred to as ground. Depletion mode MOSFET 18 has its drain connected to node 13 and its gate and source connected to node 19. Enhancement mode MOSFET 21 has its source connected to node 20, its drain connected to node 19, and its gate connected to node 23. Depletion mode MOSFET 11 has its gate and source connected to ground, and its drain connected to node 20. Enhancement mode MOSFET 24 has its source connected to ground, its gate connected to node 19, and its drain connected to node 23. Depletion mode MOSFET 22 has its drain connected to $V_{DD}$, and its gate and source connected to node 23, at which output voltage $V_{OUT}$ is produced. The following table shows exemplary values for the channel lengths (L) and channel widths (W) for each of the MOSFETs in the FIGURE.

| Device | Channel Width | Channel Length | Ratio |
| --- | --- | --- | --- |
| 11 | 18 | 12 | 1.5 |
| 12 | 14 | 14 | 1.0 |
| 17 | 200 | 8 | 25.0 |
| 18 | 14 | 14 | 1.0 |
| 21 | 20 | 6 | 3.33 |
| 22 | 10 | 18 | 0.56 |
| 24 | 50 | 6 | 8.33 |

With these ratios and $V_{DD} = 5$ v, typical switching points would be in the range of 1.8 to 3.5 volts, dependent upon process parameter variations.

The operation is as follows. Assume that initially $V_{IN}$ is low. MOSFET 24 is in the "off" condition, and node 23 is high at $V_{DD}$ volts. MOSFET 21 is in the "on" condition, since node 23 is at $V_{DD}$ volts. Depletion mode MOSFET 22 maintains node 23 at $V_{DD}$ volts, since MOSFET 24 is off. The reason that MOSFET 24 is off is that MOSFET 18, being in the "on" condition due to the fact that it is a depletion mode MOSFET having its gate connected to its source, conducts the voltage at node 13 to the gate of MOSFET 24. Since $V_{IN}$ is low, MOSFET 17 is off, and since MOSFET 12 is a depletion mode device, and is, therefore, always in the "on" condition, node 13 is at ground, thereby holding node 19 at ground through the resistance of MOSFET 18 and thereby holding MOSFET 24 off. $V_{OUT}$ is therefore at $V_{DD}$ volts. The circuit stays in this stable condition, with both $V_{IN}$ low and $V_{OUT}$ high, until $V_{IN}$ is increased to the hysteresis point or switching point of hysteresis circuit 10.

As $V_{IN}$ increases toward $V_{DD}$ volts, MOSFET 17 is turned on, as its threshold voltage is exceeded. The geometry ratios of MOSFETs 17 and 12 are defined such that as $V_{IN}$ increases, the voltage at node 13 also gradually increases. Due to the coupling effect of depletion mode MOSFET 18, the voltage at node 19 also increases. The geometry ratios of depletion mode MOSFETS 18 and 11 and enhancement mode MOSFET 21 are selected so as to insure that the voltage at node 19 also increases as $V_{IN}$ as the voltage at node 13 increase. Eventually, the voltage at node 19 increases to the point where MOSFET 24 begins to be turned on hard. This results in the voltage at node 23 being pulled toward ground. This, in turn, results in MOSFET 21 being turned off, since it is an enhancement mode transistor. The voltage at node 19 then begins to rise toward the voltage at node 13. This causes regenerative action resulting in MOSFET 21 being turned off even more rapidly, and in the voltage at node 19 rising yet more rapidly, lowering the voltage at node 23 from $V_{DD}$ volts to ground.

Once MOSFET 24 is turned on, a lower value of $V_{IN}$ is required than the value of the original hysteresis voltage point in order to turn MOSFET 24 off again. This is due to the fact that depletion mode MOSFETs 18 and 11 and enhancement mode MOSFET 21 form a voltage divider network which is "deactivated" until MOSFET 21 begins to be turned on rather substantially. But once $V_{IN}$ has been reduced from $V_{DD}$ volts toward ground to the point at which the voltage on node 19 (which is equal to the voltage on node 13, since MOSFET 21 is off and no current flows through depletion mode MOSFET 18) has reduced the overdrive voltage to MOSFET 24 sufficiently that node 23 rises enough to begin turning MOSFET 21 on, the feedback from node 23 turns MOSFET 21 on, thereby "activating" the above-mentioned voltage divider network and turning enhancement mode MOSFET 21 on harder. This operation results in regenerative switching wherein the voltage at node 13 falls even faster toward ground, and causing MOSFET 24 to be turned off yet faster, by means of depletion mode MOSFET 18. Consequently, once $V_{IN}$ passes the second hysteresis point, $V_{OUT}$ rapidly switches from ground to $V_{DD}$.

Use of an enhancement MOSFET for MOSFET 21 provides good 37 tracking" of threshold voltage between MOSFETs 22 and 24. This minimizes the effect of temperature and process variations on circuit performance.

What is claimed is:

1. A field effect transistor hysteresis circuit comprising:
   an input and an output;
   first and second field effect transistors, the sources of said first and second field effect transistors being coupled, respectively, to a first voltage means, the gate of said first field effect transistor being coupled to the drain of said second field effect transistor, and the gate of said second field effect transistor being coupled to the drain of said first field effect transistor;
   first load means coupled between a second voltage means and the drain of said second field effect transistor;
   an input field effect transistor having its gate coupled to said input;
   coupling means for coupling the source of said input field effect transistor to the drain of said first field effect transistor;
   first current source means coupled between the source of said input field effect transistor and said first voltage means; and
   second current source means coupling the source of said first field effect transistor to said first voltage means.

2. The field effect transistor hysteresis circuit as recited in claim 1 wherein said first load means is a first depletion mode field effect transistor having its gate connected to its source and to the drain of said second field effect transistor and its drain coupled to said second voltage means.

3. The field effect transistor hysteresis circuit as recited in claim 2 wherein said coupling means is a depletion mode field effect transistor having its source connected to its gate and to the drain of said first field effect transistor and having its drain connected to the source of said input field effect transistor.

4. The field effect transistor hysteresis circuit as recited in claim 3 wherein said first current source means is a third depletion mode field effect transistor having its source and gate connected to said first voltage means and its drain connected to the source of said input field effect transistor.

5. The field effect transistor hysteresis circuit as recited in claim 3 wherein said second current source means is a third depletion mode field effect transistor having its source and gate connected to said first voltage means and its drain connected to the source of said first field effect transistor.

* * * * *